United States Patent
Lee (12)

(10) Patent No.: US 11,521,957 B1
(45) Date of Patent: Dec. 6, 2022

(54) SEMICONDUCTOR DEVICE AND METHOD OF MANUFACTURE

(71) Applicant: RFHIC Corporation, Anyang-si (KR)

(72) Inventor: Won Sang Lee, Chapel Hill, NC (US)

(73) Assignee: RFHIC CORPORATION, Anyang-si (KR)

( * ) Notice: Subject to any disclaimer, the term of this patent is extended or adjusted under 35 U.S.C. 154(b) by 0 days.

(21) Appl. No.: 17/370,597

(22) Filed: Jul. 8, 2021

(51) Int. Cl.
| | |
|---|---|
| *H01L 23/00* | (2006.01) |
| *H01L 25/18* | (2006.01) |
| *H01L 29/778* | (2006.01) |
| *H01L 29/16* | (2006.01) |
| *H01L 23/48* | (2006.01) |
| *H01L 23/31* | (2006.01) |
| *H01L 25/00* | (2006.01) |
| *H01L 21/56* | (2006.01) |
| *H01L 21/78* | (2006.01) |
| *H01L 29/267* | (2006.01) |

(52) U.S. Cl.
CPC ............ *H01L 25/18* (2013.01); *H01L 21/561* (2013.01); *H01L 21/78* (2013.01); *H01L 23/3157* (2013.01); *H01L 23/481* (2013.01); *H01L 24/06* (2013.01); *H01L 24/16* (2013.01); *H01L 24/94* (2013.01); *H01L 25/50* (2013.01); *H01L 29/1602* (2013.01); *H01L 29/267* (2013.01); *H01L 29/7786* (2013.01); *H01L 2224/06181* (2013.01); *H01L 2224/13144* (2013.01); *H01L 2224/16145* (2013.01)

(58) Field of Classification Search
CPC ....... H01L 25/18; H01L 21/561; H01L 21/78; H01L 23/3157; H01L 23/481; H01L 24/06; H01L 24/16; H01L 24/94; H01L 25/50; H01L 29/1602; H01L 29/267; H01L 29/7786; H01L 2224/06181; H01L 2224/13144; H01L 2224/16145
See application file for complete search history.

(56) References Cited

U.S. PATENT DOCUMENTS 10,594,266 B2 * 3/2020 Krehbiel ................. H01L 23/66

* cited by examiner

*Primary Examiner* — Elias Ullah
(74) *Attorney, Agent, or Firm* — Kim & Stewart LLP (57) ABSTRACT

In one embodiment, a semiconductor device includes a first substrate with a transistor formed in a first active are, a first bonding pad electrically connected to the transistor and a first metal pad surrounding the first active area. A second substrate of a type that is different from the first substrate includes a passive circuit element in a second active area on a front surface, a second bonding pad electrically connected to the passive circuit element, a second metal pad surrounding the second active area, and a mounting pad on a back surface of the second substrate with a through-via electrically connecting the second bonding pad to the mounting pad. A first interconnection extends from the first bonding pad to the second bonding pad, and a second interconnection extends from the first metal pad to the second metal pad and surrounds the region through which the first interconnection extends.

20 Claims, 6 Drawing Sheets

SEMICONDUCTOR DEVICE AND METHOD OF MANUFACTURE

FIELD

The present disclosure relates generally to semiconductor devices and methods of manufacturing semiconductor devices such as high-electron mobility transistor devices.

BACKGROUND

Gallium nitride (GaN), aluminum gallium nitride (AlGaN), and aluminum nitride (AlN) semiconductor materials are often used for making semiconductor devices for radio frequency (RF) applications. Such devices for RF applications may include high electron mobility transistors (HEMTs) formed on wafer substrates comprising GaN, AlGaN, AlN ("GaN-type" or "GaN related") semiconductor materials. These semiconductor devices tend to generate substantial heat during operation. The generated heat must be dissipated to avoid device failures. One heat dissipation technique is to form thin layers of GaN-type materials on a substrate of a material with good thermal conductivity. Layers of GaN-type materials may be epitaxially formed on a silicon carbide (SiC) wafer, for example.

To further improve heat dissipation, the SiC wafer may be bonded to another wafer, such as a diamond wafer, after the formation of HEMTs or the like in the GaN-type material on the SiC wafer. Diamond has good thermal properties and may also improve the mechanical strength of the final device. However, thicker diamond and thinner SiC wafer substrates are difficult to process in wafer bonding processes. Thinner SiC wafer substrates may be relatively fragile for handling during device fabrication steps and/or provide insufficient thermal and/or DC/RF properties to the final device. Additionally, wire bonding processes have been found to be a technical barrier to the improvement of device performance for high frequency (e.g., over 10 GHz) operation. As such, new device designs and manufacturing techniques are required to provide semiconductor devices for RF-type and other applications that require good thermal and DC/RF characteristics.

DETAILED DESCRIPTION

In at least one embodiment, a semiconductor device includes a first substrate of a first type. A first active area is at a first surface of the first substrate. A transistor is formed in the first active area. A first bonding pad is formed on the first surface and is electrically connected to the transistor. A first metal pad is formed on the first surface surrounding the first active area. A first resin material covers the first surface and portions of the first bonding pad and the first metal pad. A second substrate of a second type that is different from the first type is provided in the semiconductor device. The second substrate has a second active area at a second surface of the second substrate. A passive circuit element is formed in the second active area. A second bonding pad is formed on the second surface and is electrically connected to the passive circuit element. A mounting pad is formed on a third surface of the second substrate. The third surface is on an opposite side of the second substrate from the second surface. A through-via extends through the second substrate and electrically connects the second bonding pad to the mounting pad. A second metal pad is formed on the second surface surrounding the second active area. A second resin material covers the second surface and portions of the second bonding pad and second metal pad. A first interconnection extends from the first bonding pad to the second bonding pad and electrically connects the first bonding pad to the second bonding pad. A second interconnection extends from the first metal pad to the second metal pad. The second interconnection surrounds a region through which the first interconnection extends.

In at least one other embodiment, a method of manufacturing a semiconductor device includes forming high electron mobility transistors in a plurality of first active areas spaced from each on a first surface of a first type wafer, forming first bonding pads on each of the first active areas of the first type wafer, forming first metal pads on the first surface of the first type wafer. Each first metal pad respectively surrounds one of the first active areas as frame-like element. The method further includes depositing a solder layer on the first bonding pads and the first metal pads, forming a first resin material layer over the first surface covering the first bonding pads and the first metal mads, and then forming holes in the first resin material layer to expose portions of the first bonding pads and the first metal pads. On a second type wafer of a type different from the first type wafer, passive circuit elements are formed in a plurality of second active areas that are spaced from each other on a second surface of the second type wafer. Through-holes are formed within the planar locations of the second active areas. The through-holes extend through the second type wafer from the second surface to a third surface on an opposite side of the second type wafer. Second bonding pads are formed on the second surface in the second active areas at positions above the through-holes. The method further includes forming second metal pads on the second surface surrounding the second active areas, forming metal bump connectors on the second bonding pads and the second metal pads, forming a second resin material layer on the second surface such that the metal bump connectors protrude from an upper surface of the second resin material layer, and then forming a through-via in each of the through-holes in the second type wafer and mounting pads on the third surface of the second type wafer. The mounting pads are electrically connected to the through vias. The first surface of the first type wafer is then placed into a facing arrangement with the second surface of the second type wafer and the holes in the first resin material layer are aligned with the metal bump connectors. The first type wafer and the second type wafer are then bonded to each other by pressing the metal bump connectors against the first bonding pads and the first metal pads while heating the first type wafer and the second type wafer. After the bonding, a laser cutting is performed to cut through the second type wafer from the third surface at positions between adjacent second active areas. After the laser cutting through the second type wafer, a laser cutting is performed through the first type wafer from a surface of the first type wafer on a opposite side of the first surface. This laser cut reaches to the depth of the second surface of the second type wafer.

In some embodiments of the method, the bonding of the first type wafer and the second type wafer takes place in a vacuum or inert gas (e.g., nitrogen, argon, or the like) atmosphere.

In some embodiments of the method, the first type wafer comprises gallium nitride and silicon carbide layers, the second type wafer is a diamond wafer, the metal bump connectors are gold, the solder layer is a tin-gold (AuSn) alloy, and the first and second resin material layers are a benzocyclobutene-based polymeric material.

The accompanying drawings are provided for the purposes of explanation and are merely schematic. As such, depicted dimensions are not intended to reflect any particular scale relationship within a single drawing or between different drawings. Likewise, dimensional ratios between different depicted components in the drawings are not intended to necessarily reflect those in an actual device. The depicted numbers of repeated instances of any particularly depicted component do not necessarily reflect those in an actual device. That is, the depicted number of any element is generally set for the purpose of descriptive clarity rather than to be directly representative of the total number of the element in an actual device. The various methods of manufacture described in the present disclosure may omit or combine certain processes and for some example processes described as occurring in a single step, the processing may be divided into different steps and/or a series of sub-steps.

Semiconductor Device Example

Figure 1:
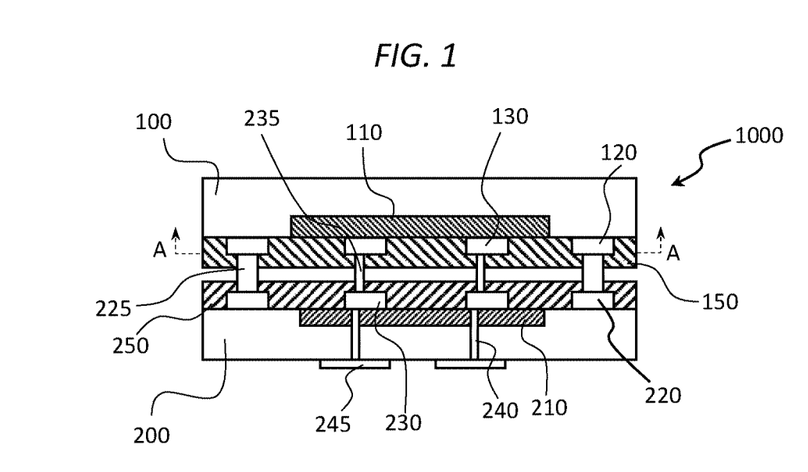
FIG. 1 depicts a semiconductor device of an embodiment in a cross-sectional view.

FIG. 1 depicts a device 1000 incorporating a transistor-based integrated circuit. FIG. 1 is a cross-section view of device 1000. In this example, device 1000 comprises a monolithic microwave integrated circuit (MMIC) including high-electron mobility transistors (HEMTs) that have been fabricated in gallium nitride (GaN) layers on a silicon carbide (SiC) substrate.

In particular, device 1000 includes a substrate 100 formed from a portion of a gallium nitride/silicon carbide epitaxial wafer. Substrate 100 includes thereon an active area 110 with various layers and/or regions of GaN (or a GaN related material). At least one HEMT is formed in the active area 110. Reference to an "active area" in this context refers to a portion of substrate in which circuit elements are formed or can be formed. For example, an active area may comprise various regions and/or layers of semiconductive material including n-type and/or p-type dopants.

Substrate 100 is about 500 microns (μm) thick. The planar shape of substrate 100 in this example is substantially rectangular (see FIG. 2). The planar dimensions are, for example, about 3 mm by 1.5 mm.

In addition to the at least one HEMT of active area 110, various other circuit elements and electrical connections between circuit elements and sub-components are also included in active area 110. Bonding pads 130 are provided on the active area 110 to permit additional electrical connections to the components in the active area 110. These bonding pads 130 are formed of an electrically conductive metal material. Bonding pads 130 may comprise as single metal, an alloy of different metals, and/or stacked layers of one or more metals.

Figure 2:
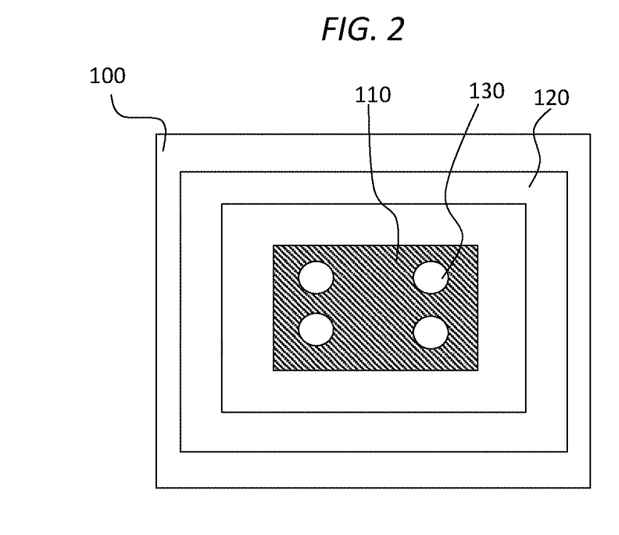
FIG. 2 depicts a semiconductor device of an embodiment in a plan view.

A metal pad 120 is provided on the substrate 100 outside the active area 110. As depicted in the plan view of FIG. 2, which is a simplified cross-section taken at line A-A in FIG. 1, the metal pad 120 is formed in a frame shape surrounding the active area 110 and the bonding pads 130. While FIG. 2 depicts metal pad 120 as a rectangular frame, the specific shape of metal pad 120 is not limited to any particular shape so long as metal pad 120 surrounds (encloses) the active area 110. In other examples, the metal pad 120 may have rounded or chamfered corners, be a circular, oval, polygonal, or irregular shape. The composition of metal pad 120 can be the same as that of the bonding pads 130 for manufacturing convenience, but in some examples the composition may differ from that of the bonding pads 130.

Device 1000 also includes a substrate 200 formed from a portion of a diamond wafer. Substrate 200 includes an active area 210 including various passive circuit elements such as, for example, wiring, resistors, capacitors, inductors, transmission lines, matching circuit components, and electrostatic discharge (ESD) protection circuitry. Substrate 200 is, for example, about 300 microns (μm) thick. The planar shape and planar dimensions of substrate 200 in this example correspond to those of substrate 100.

In addition to passive circuit elements, various electrical connections between components and sub-components are also included in active area 210. Bonding pads 230 are provided on the active area 210 to permit additional electrical connections to components in the active area 210. The bonding pads 230 are an electrically conductive metal material. Bonding pads 230 may comprise as single metal, an alloy of different metals, and/or stacked layers of one or more metals.

A metal pad 220 is provided on the substrate 200 outside the active area 210. The metal pad 220 is in a frame shape corresponding to the shape of the metal pad 120. Metal pad 220 thus surrounds the active area 210 and the bonding pads 230. In the present example, when the device 1000 is viewed from a direction orthogonal to the main surface of substrate 200 (as depicted in FIG. 2), the position of metal pad 120 overlaps the position of metal pad 220. However, exact and total overlap in planar position of these two components is not necessarily required in all examples. Likewise, planar dimensions of these two components do not necessarily have to be equal in all examples.

The bonding pads 230 are positioned to correspond to the positions of bonding pads 130, but exact correspondence in position and/or shapes is not necessarily required between these different elements. Corresponding bonding pads 130 and bonding pads 230 are electrically connected to each other by an interconnection 235. Interconnection 235 is an electrically conductive material. Each interconnection 235 is approximately 20 μm in height. As depicted in FIG. 1, the width of interconnection 235 is less than that of the bonding pads 130 and bonding pads 230, but this not necessarily required in all examples.

In the present example, metal pad 220 is positioned to match the position of metal pad 120, but precise correspondence in position is not necessarily required between these different elements. The metal pad 120 and metal pad 220 are connected to each other by an interconnection 225. Interconnection 225 is an electrically conductive material. The interconnection 225 is approximately 20 μm in height. As depicted in FIG. 1, the width (x-direction) of interconnection 225 is less than that of the metal pad 120 and metal pad 230, but this not necessarily required in all examples. The planar shape of interconnection 225 corresponds to the shape of metal pad 120 and metal pad 220. As such, in this example, interconnection 225 has a rectangular frame shape.

In the present example, interconnections 235 and interconnection 225 are composed of the same material, which is gold (Au).

Substrate 100 is covered by a resin material 150. Resin material 150 covers portions of the surface of substrate 100, active area 110, metal pad 120, and bonding pads 130.

Substrate 200 is similarly covered by a resin material 250. Resin material 250 covers portions of the surface of the substrate 200, active area 210, metal pad 220, and bonding pads 230.

The resin material 150 and resin material 250 can be composed of the same material or different materials. The resin material 150 is about 5 µm thick as measured from the surface of substrate 100. The resin material 250 is also about 5 µm thick as measured from the surface of the substrate 200.

FIG. 1 depicts a space or gap left between resin material 150 and resin material 250. The depicted size of the gap is not necessarily to scale and, in some instances, there may be contact or partial contact between these two resin materials. The presence of a frame-like structure (formed by metal pad 120, interconnection 225, and metal pad 220) surrounding the active areas (110 and 210) serves to seal the various circuit components in the device 1000 from the surrounding atmosphere.

By controlling the composition of the ambient atmosphere during certain manufacturing steps to be, for example, inert gas or even vacuum, the composition of the atmosphere within the region sealed inside the frame-like structure can be controlled.

Substrate 200 includes through-via structures 240 that electrically connect to bonding pads 230 (and thus also to bonding pads 130 via interconnections 235). Alternatively, a through-via structure 240 may connect to a circuit component or wiring within active area 210, which is in turn connected to a bonding pad 230. The through-via structures 240 are electrically connected to pads 245. Pads 245 are surface mount pads ("SMT pads") in this example. The pads 245 permit the device 1000 to be electrically connected to other devices and/or other apparatus components such as, for example, a printed circuit board 300 (see FIG. 6) via soldering (e.g., using solder balls 310) or the like.

Device 1000 may be referred to as a chip-scale package (CSP).

Method of Manufacture

In general, device 1000 is formed by joining two separate wafer types, then singulating (dicing) the joined wafers into individual devices 1000 produced from the joined wafers.

Figure 3:
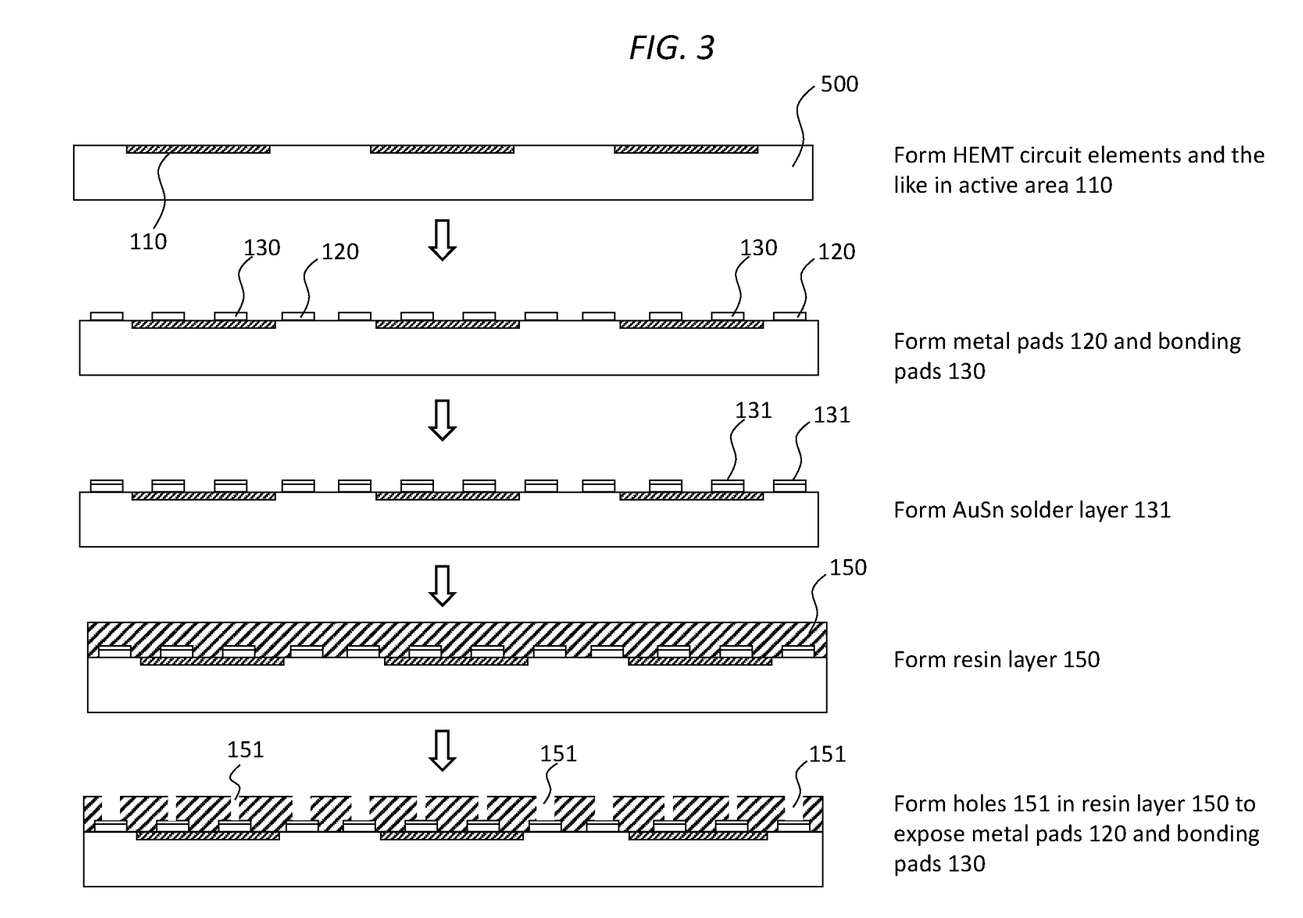
FIG. 3 depicts aspects of a method of preparing a first wafer.

FIG. 3 depicts the preparation of a first wafer 500. The first wafer 500 is a GaN/SiC wafer. Note, substrate 100 (see FIG. 1) is a diced portion of the first wafer 500. On first wafer 500, several active areas 110 are formed in positions corresponding to individual dies. As described-above, various circuit elements or structures including a HEMT can be formed in the active areas 110 according to standard semiconductor device fabrication processes.

After completion of the active area 110 fabrication processes, metal pads 120 and bonding pads 130 are formed on the first wafer 500 by standard patterning processes. The metal pads 120 and bonding pads 130 can be formed in the same processing steps and of the same material or in different processing steps of different material. In the present example, the metal pads 120 and bonding pads 130 are formed of gold that is deposited by electroplating, e-beam deposition, or sputtering.

After the formation of the metal pads 120 and bonding pads 130, a gold-tin (AuSn) solder layer 131 is formed on the metal pads 120 and bonding pads 130 to promote the eventual bonding of the second wafer 400 and the first wafer 500. The AuSn solder layer 131 can be formed by e-beam deposition, sputtering, or electroplating processes.

Next, a layer of resin material 150 is formed on the first wafer 500. In this example, resin material 150 is a benzocyclobutene-based material. The resin material 150 can be a spin-on polymeric material or otherwise supplied. The resin material 150 is a dielectric (electrically insulating) material. In some examples, resin material 150 can itself be a photolithographically patternable photoresist material or otherwise may be patterned in photolithographic patterning processes to form holes 151 that expose portions of the underlying metal pads 120 and bonding pads 130.

Figure 4:
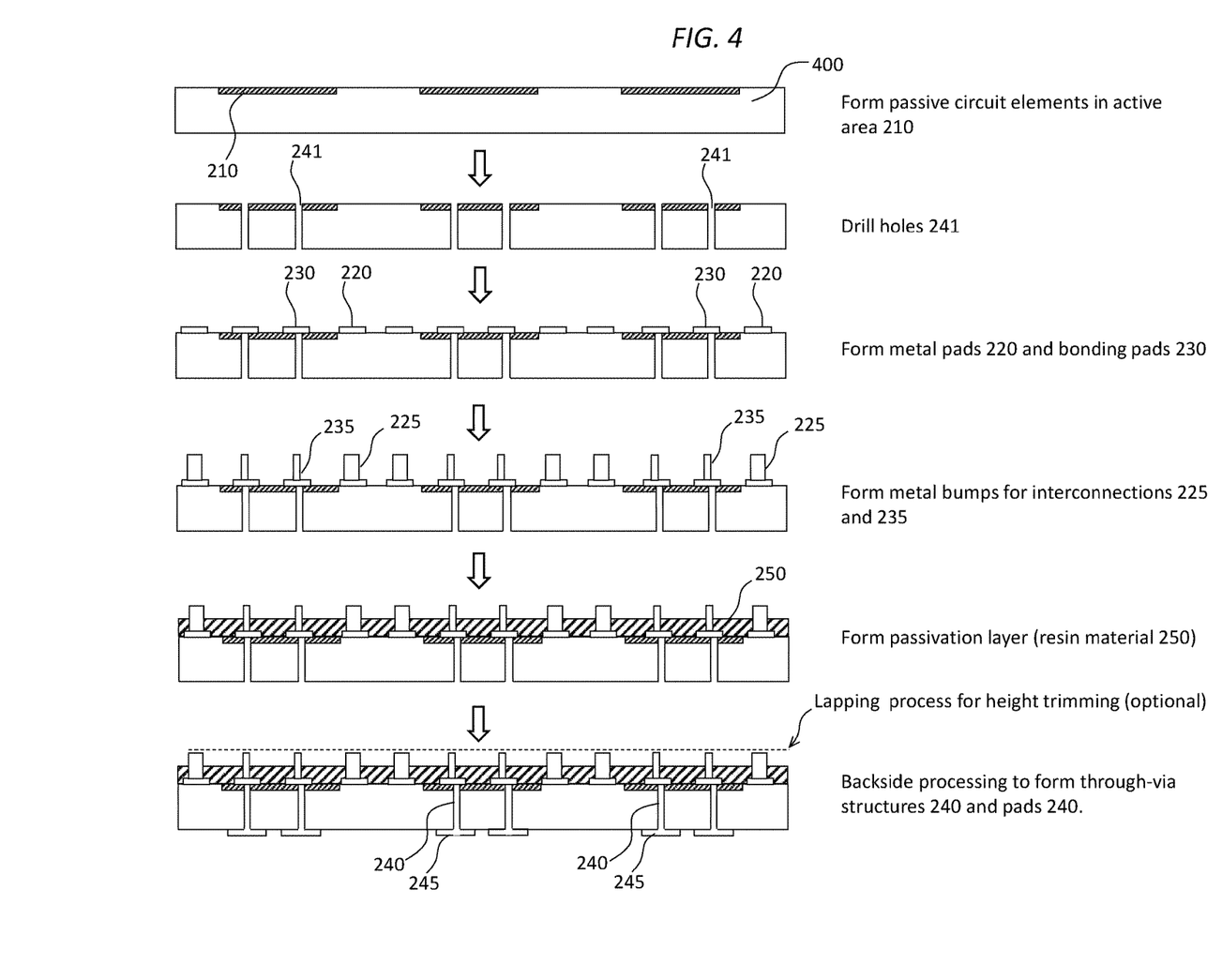
FIG. 4 depicts aspects of a method of preparing a second wafer.

FIG. 4 depicts the preparation of a second wafer 400. The second wafer 400 is a diamond wafer. Note, substrate 200 (see FIG. 1) is a diced portion of the second wafer 400. On second wafer 400, several active areas 210 are formed in positions corresponding to individual dies. As described-above, various passive circuit elements or structures can be formed in the active areas 210 according to standard semiconductor device fabrication processes.

After completion of the active area 210 fabrication processes, holes 241 for through-via structures 240 are formed in the second wafer 400. The holes 241 are formed by a laser drilling process or the like. In general, the holes 241 pass through the second wafer 400 at positions corresponding to active areas 210. While the holes 241 in the depicted cross-section of FIG. 4 might appear to disassociate different pieces of the second wafer 400 from one another, the holes 241 are localized in position and the second wafer 400 maintains its structural integrity (unity).

After formation of the holes 241, metal pads 220 and bonding pads 230 are formed by a photolithographic patterning step or steps. The interconnections 225 and interconnections 235 can be formed in the same processing step(s) as the metal pads 220 and bonding pads 230 or in a subsequent processing step or steps. The metal for these structures can be deposited by a gold plating process. The interconnections 225 and interconnections 235 at this point in the process may be referred to as bumps or gold bumps in some instances.

After these metal deposition processes, the second wafer 400 is covered with resin material 250. In this example, resin material 250 is a benzocyclobutene-based polymeric material. The resin material 250 can be a spin-on material or otherwise supplied. The resin material 250 is a dielectric (electrically insulating) material. The resin material 250 may be a photolithographically patternable photoresist material in some examples.

The through-via structures 240 and the pads 245 are formed by a backside plating process. Pads 245 and through-via structures 240 are, for example, gold.

The interconnections 225 and interconnections 235 protrude from the resin material 250. For example, the resin material 250 is about 5 µm thick and the bumps protrude beyond the resin material 250 by another 15 µm or so. A polishing or lapping process can by utilized to reduce and equalize the height of the interconnections 225 and interconnections 235 to promote the eventual bonding of interconnections 225 and interconnections 235 to metal pads 120 and bonding pads 130, respectively.

Figure 5:
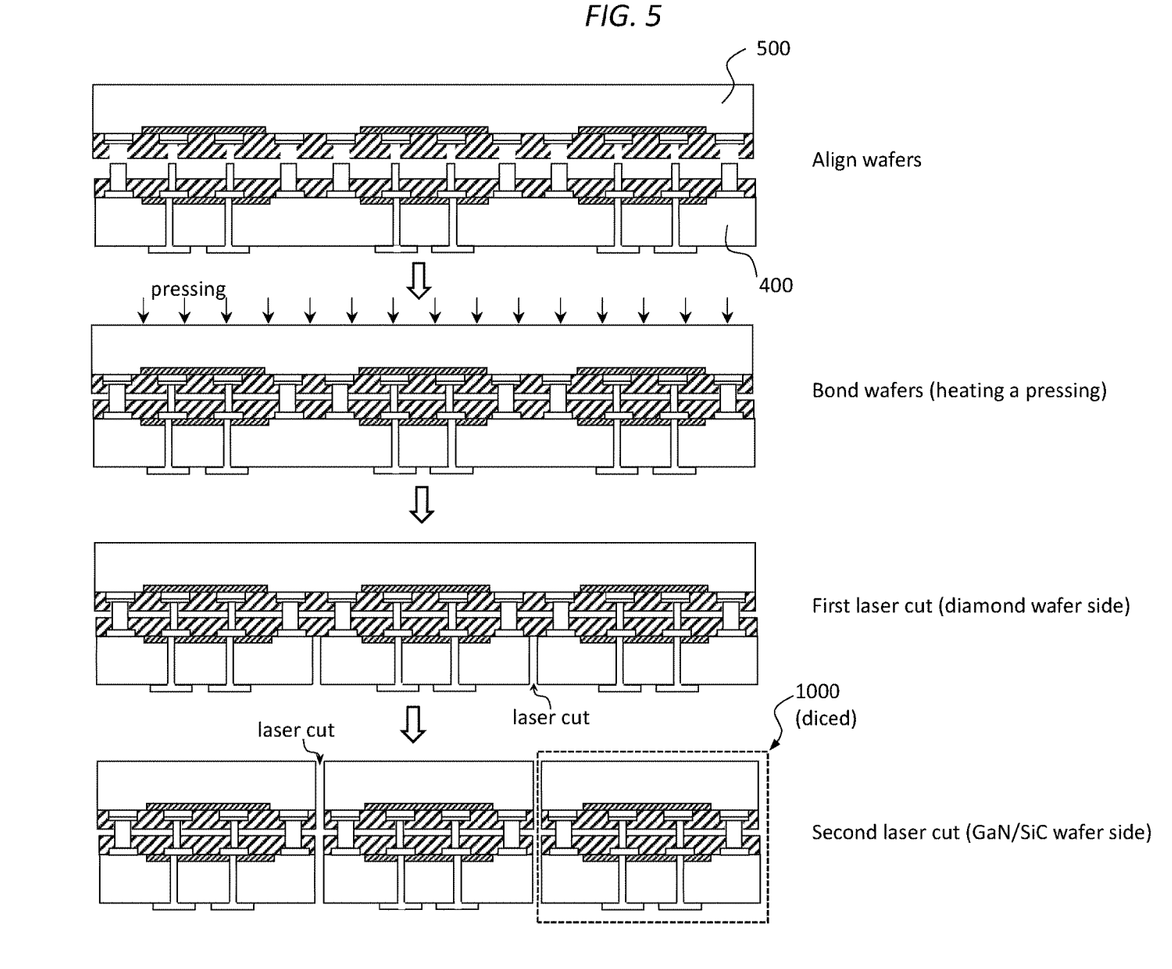
FIG. 5 depicts aspects of a method of joining a first wafer and a second wafer, then dicing of the joined wafers.

FIG. 5 depicts the joining of second wafer 400 and first wafer 500 and then the dicing of the individual devices 1000 from the joined wafers.

The second wafer 400 is placed in a facing arrangement with the first wafer 500. In the present example, the second wafer 400 faces upward and the first wafer 500 is flipped from the orientation shown in FIG. 3 to face downward. The interconnections 225 and interconnections 235 that protrude from the resin material 250 are aligned with the corresponding holes 151 formed in the resin material 150. The first wafer 500 is then pressed against the second wafer 400.

This bonding process to join the two wafers takes place at approximately 230° C. to permit a eutectic welding of the interconnections 225 to the metal pads 120 and the interconnections 235 to the bonding pads 130 via the AuSn solder layer 131 formed on the interconnections 225 and 235. The aligning/pressing processing can take place in a vacuum or inert gas ambient atmosphere. Performing the joining in a controlled ambient atmosphere helps prevent faults in the final device 1000.

The frame-shaped structures formed by metal pads 120, interconnections 225, and metal pads 220 form hermetically sealed interior regions in which an active area 110 and an active area 210 are enclosed.

After joining of the second wafer 400 and first wafer 500, the separation (dicing) of the individual devices 1000 begins. FIG. 5 shows a laser cutting operation is performed from the second wafer 400 back-surface side. This first cutting operation cuts only through the second wafer 400 portion of the joined wafers.

Next, a second laser cutting operation is performed from the first wafer 500 back-surface side. This second cutting operation cuts through to first wafer 500 to a previous laser cut already made in the second wafer 400. Alignment of the first and second cuts is facilitated by the transparency of the first wafer 500.

After this second cutting operation, the individual devices 1000 are separated from one another and can be used individually.

The presence of pads 245 on the back-surface side of the second wafer 400 permits testing (inspection) of devices 1000 prior to the dicing operations, if desired. As such, in some examples, dicing/separation operations can be performed only on those devices 1000 passing testing or inspection.

Figure 6:
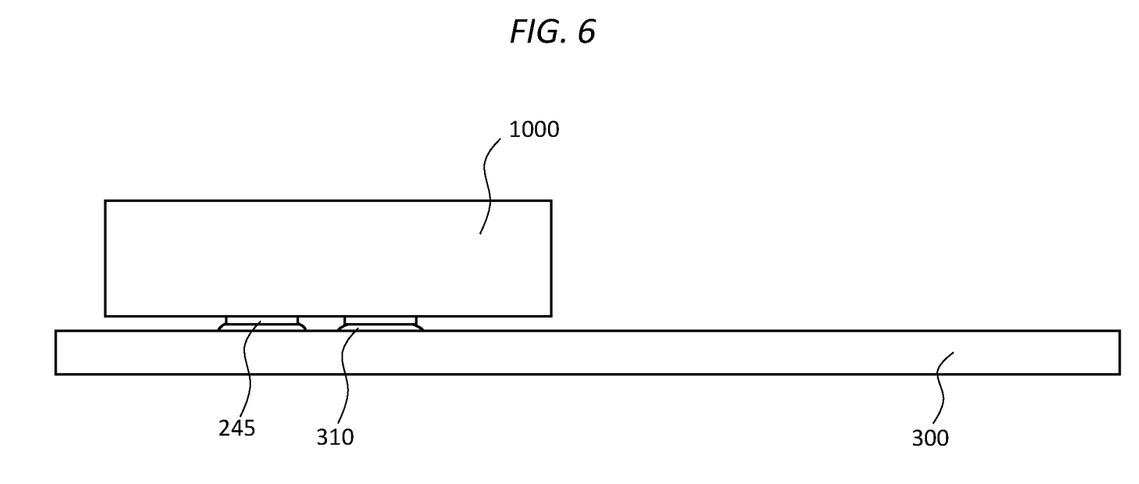
FIG. 6 depicts an electronic apparatus incorporating a semiconductor device of an embodiment.

FIG. 6 shows a device 1000 incorporated as a component in an electronic apparatus or the like. The electronic apparatus includes a printed circuit board 300 with various wiring patterns thereon and/or therein. Additional components may be mounted on the printed circuit board 300 and connected to the wiring patterns. The device 1000 is electrically connected to wiring of the printed circuit board 300 via solder balls 310. The solder balls 310 are connected to the pads 245. While only two pads 245 are depicted in FIG. 6, typically several more pads 245 would be utilized.

Figure 7:
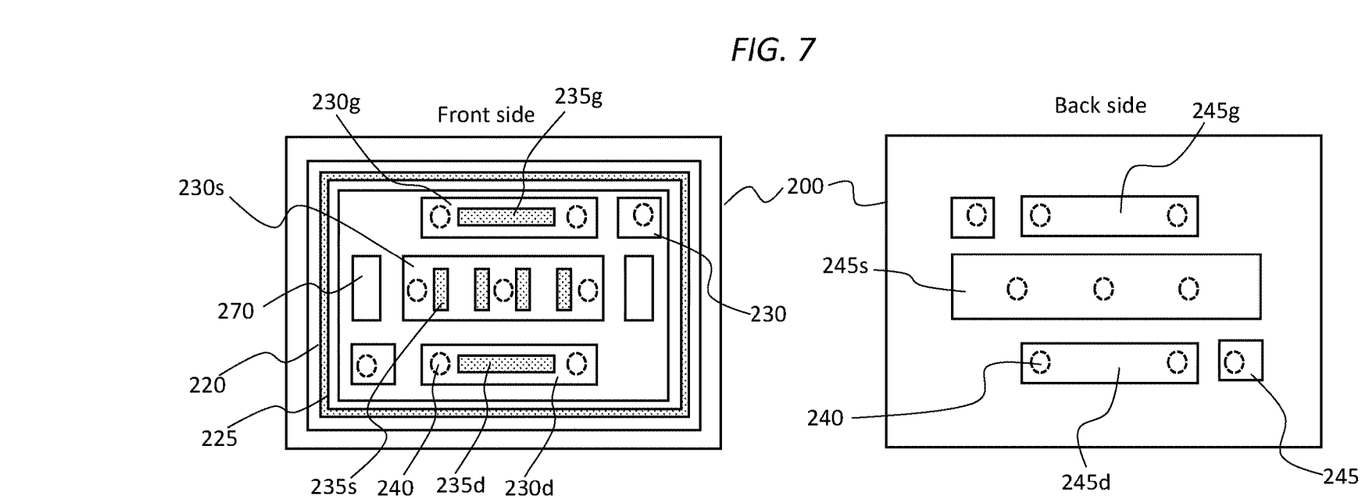
FIG. 7 depicts a front side and back side of a diamond wafer in a schematic example.
Figure 8:
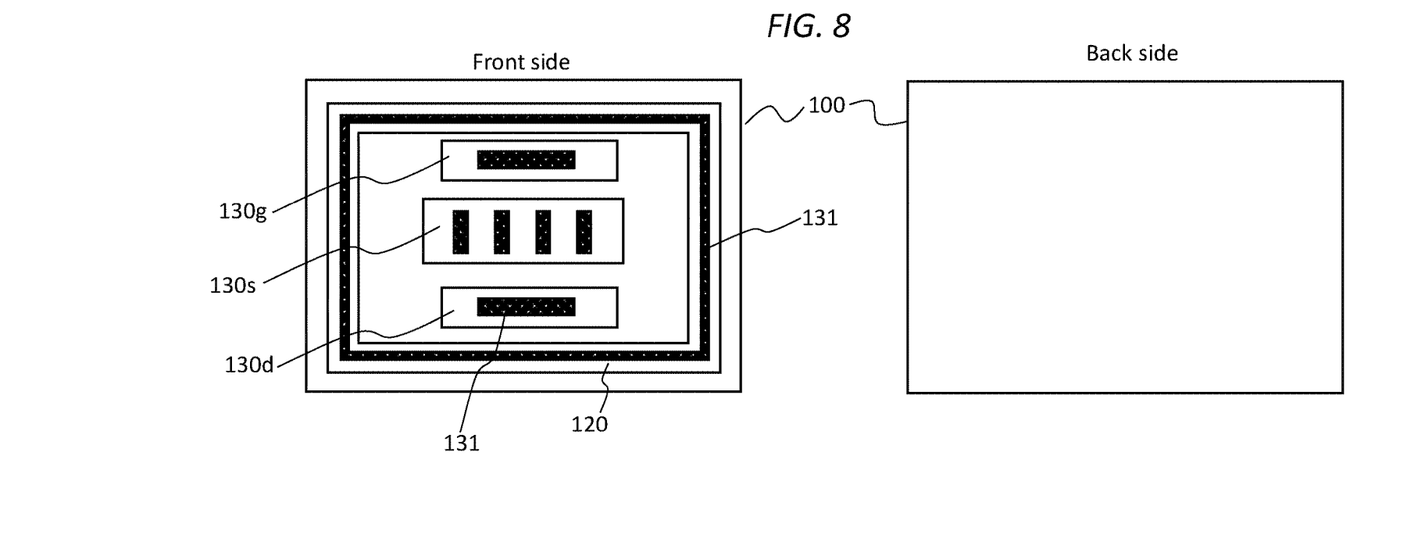
FIG. 8 depicts a front side and back side of a GaN/SiC HEMT wafer in a schematic example.

FIG. 7 depicts a front side and back side of a substrate 200 in a schematic example embodiment. FIG. 8 depicts a front side and back side of a substrate 100 in the same schematic example embodiment. In general, the depiction of the front side of the substrate 200 in FIG. 7 corresponds to the description of associated with FIG. 1. In general, the depiction of the front side of the substrate 100 in FIG. 8 corresponds to the description of associated with FIG. 1 and FIG. 2. Additional details related to component layout corresponding to this particular example are depicted in FIG. 7 and FIG. 8. FIG. 7 and FIG. 8 are not to scale with respect to relative sizing of the various components within the depicted example.

The front side of substrate 200 has an active area 210 (see FIG. 1) as previously described, but the position of the active area 210 is not specifically indicated in FIG. 7. Various bonding pads 230 are depicted on the front side of substrate 210 in FIG. 7. In particular, positions of a source bonding pad 230s, a drain bonding pad 230d, and gate bonding pad 230g are illustrated. Positions of nine different through-via structures 240 extending through the thickness of the substrate 200 are illustrated as dashed line circles since the through-via structures 240 are below the bonding pads 230 and inside the substrate 200. Positions for two different passive elements 270 formed in the active area 210 are shown. As described above, a passive element 270 is, for example, a capacitor, resistor, inductor, transmission line, combinations of such elements, or the like.

A frame-like metal pad 220 is on the front side of substrate 200 (surrounding the active area 210). A frame-like interconnection 225 is on the metal pad 220. Positions of various interconnections 235 are also shown. In particular, multiple source interconnections 235s are shown on the one source bonding pad 230s. The source interconnections 235s are depicted as shaded rectangles. A drain interconnection 235d and a gate interconnection 235g are also depicted as shaded rectangles on the drain bonding pad 230d and gate bonding pad 230g, respectively. The interconnection 225, the source interconnections 235s, the drain interconnection 235d and gate interconnections 235g each protrude from the front side of substrate 200 as described above (see e.g., FIG. 4). In the depicted unconnected/unbonded state of FIG. 7, interconnection 225, the source interconnections 235s, the drain interconnection 235d, and the gate interconnection 235g may be referred to as metal bumps, metal bump connectors, gold bumps, or the like.

The back side of substrate 200 in FIG. 7 has various pads 245. In particular, positions for a source pad 245s, a drain pad 245d, and gate pad 245g are shown. Other pads 245 may be provided (beyond those depicted) as necessary for power supply and signal input/out. The various pads 245 in FIG. 7 are surface mount pads (SMT pads).

FIG. 8 depicts a frame-like metal pad 120 and various bonding pads 130 on the front side of substrate 100. In particular, a source bonding pad 130s, a drain bonding pad 130d, and a gate bonding pad 130g are depicted. Also, depicted are the positions for various solder layers 131. The positions for the solder layers 131 correspond to positions of the drain interconnection 235d, the source interconnections 235s, the gate interconnection 235g, and the frame-like interconnection 225 shown in FIG. 7. The source bonding pads 130s electrically connect to a source terminal of a HEMT formed in substrate 100 (in active area 110, not labeled in FIG. 8). The drain bonding pad 130d electrically connects to a drain terminal of the HEMT. The gate bonding pad 130g electrically connects to a gate terminal of the HEMT. Other bonding pads 130 may be provided as necessary.

The back side of substrate 100 is bare. That is, there are no pads or electrical connector points on the back side of substrate 100. The HEMT in substrate 100 can thus be formed using only front side processing steps and there is no need for back side processing on substrate 100 (or a wafer 500).

While certain example embodiments have been described, the present disclosure is not limited to specific examples. Various modifications will be apparent to those of ordinary skill from the description of the specific examples and such modifications are within the scope of the present disclosure. The following claims are intended to encompass such embodiments, modifications, and equivalents within the scope of the present disclosure.

The invention claimed is:

1. A semiconductor device, comprising:
 a first substrate of a first type;
 a first active area at a first surface of the first substrate;
 a transistor formed in the first active area;
 a first bonding pad on the first surface and electrically connected to the transistor;
 a first metal pad on the first surface surrounding the first active area;
 a first resin material covering the first surface and portions of the first bonding pad and the first metal pad;
 a second substrate of a second type that is different from the first type;
 a second active area at a second surface of the second substrate;
 a passive circuit element formed in the second active area;
 a second bonding pad on the second surface and electrically connected to the passive circuit element;
 a mounting pad on a third surface of the second substrate, the third surface being on an opposite side of the second substrate from the second surface;
 a through-via extending through the second substrate and electrically connecting the second bonding pad to the mounting pad;
 a second metal pad on the second surface surrounding second active area;
 a second resin material covering the second surface and portions of the second bonding pad and second metal pad;
 a first interconnection extending from the first bonding pad to the second bonding pad and electrically connecting the second bonding pad to the second bonding pad; and
 a second interconnection extending from the second metal pad to the second metal pad, the second interconnection surrounding a region through which the first interconnection extends.

2. The semiconductor device according to claim 1, wherein the first substrate comprises gallium nitride and silicon carbide layers.

3. The semiconductor device according to claim 2, wherein the second substrate comprises diamond.

4. The semiconductor device according to claim 3, wherein the transistor is a high electron mobility transistor.

5. The semiconductor device according to claim 4, wherein
 the first interconnection comprises gold, and
 the second interconnection comprises gold.

6. The semiconductor device according to claim 3, wherein the second interconnection is a rectangular frame shape.

7. The semiconductor device according to claim 3, wherein
 the first resin material is a benzocyclobutene-based polymeric material, and
 the second resin material is a benzocyclobutene-based polymeric material.

8. The semiconductor device according to claim 3, wherein the first resin material does not contact the second resin material.

9. The semiconductor device according to claim 3, wherein the second substrate is at least 300 microns thick.

10. The semiconductor device according to claim 1, wherein the second substrate comprises diamond.

11. The semiconductor device according to claim 1, wherein the transistor is a high electron mobility transistor.

12. The semiconductor device according to claim 1, wherein the second interconnection is a frame shape.

13. The semiconductor device according to claim 12, wherein the second interconnection is continuous and fully encloses the region through which the second interconnection extends.

14. A chip-scale packaged semiconductor device, comprising:
 a first substrate comprising gallium nitride and silicon carbide layers;
 a first active area at a first surface of the first substrate;
 a plurality of circuit elements including at least one high-electron-mobility transistor formed in the first active area;
 a plurality of first bonding pads on the first surface and electrically connected to circuit elements;
 a first metal pad on the first surface surrounding the first active area;
 a first resin material covering the first surface and portions of the first bonding pads and the first metal pad;
 a second substrate comprising diamond;
 a second active area at a second surface of the second substrate;
 a plurality of passive circuit elements formed in the second active area;
 a plurality of second bonding pads on the second surface and electrically connected to the passive circuit elements;
 a plurality of mounting pads on a third surface of the second substrate, the third surface being on an opposite side of the second substrate from the second surface;
 a plurality of through-vias extending through the second substrate, each through-via electrically connecting a second bonding pad to a mounting pad;
 a second metal pad on the second surface surrounding second active area;
 a second resin material covering the second surface and portions of the second bonding pads and second metal pad;
 a plurality of first interconnections extending from first bonding pads to second bonding pads and electrically connecting first bonding pads to second bonding pads; and
 a second interconnection extending from the first metal pad to the second metal pad, the second interconnection enclosing a region through which the first interconnections extend.

15. The chip-scale packaged semiconductor device according to claim 14, wherein
 the first interconnection comprises gold, and
 the second interconnection comprises gold.

16. The chip-scale packaged semiconductor device according to claim 14, wherein the second interconnection is a rectangular frame shape.

17. An electronic apparatus, comprising:
 a circuit board;
 a chip-scale packaged semiconductor device according to claim 14, the chip-scale packaged semiconductor device soldered to the circuit board via the plurality of mounting pads of the chip-scale packaged semiconductor device according.

18. A method of manufacturing a semiconductor device, the method comprising:

forming high electron mobility transistors in a plurality of first active areas spaced from each on a first surface of a first type wafer;

forming first bonding pads on each of the first active areas of the first type wafer;

forming first metal pads on the first surface of the first type wafer, each first metal pad respectively surrounding one of the first active areas;

depositing a solder layer on the first bonding pads and the first metal pads;

forming a first resin material layer over the first surface covering the first bonding pads and the first metal mads;

forming holes in the first resin material layer to expose portions of the first bonding pads and the first metal pads;

forming passive circuit elements in a plurality of second active areas spaced from each other on a second surface of a second type wafer;

forming through-holes in the second active areas, the through-holes extending through the second type wafer from the second surface to a third surface on an opposite side of the second type wafer;

forming second bonding pads on the second surface in the second active areas, the second bonding pads being positioned above the through-holes;

forming second metal pads on the second surface surrounding the second active areas;

forming metal bump connectors on the second bonding pads and the second metal pads;

forming a second resin material layer on the second surface such that the metal bump connectors protrude from an upper surface of the second resin material layer;

forming a through-via in each of the through-holes in the second type wafer;

forming mounting pads on the third surface of the second type wafer, the mounting pads electrically connected to the through-vias;

placing the first surface of the first type wafer into a facing arrangement with the second surface of the second type wafer and aligning the holes in the first resin material layer to the metal bump connectors;

bonding the first type wafer and the second type wafer by pressing the metal bump connectors against the first bonding pads and the first metal pads and heating the first type wafer and the second type wafer;

after the bonding, laser cutting through the second type wafer from the third surface at positions between adjacent second active areas; and after the laser cutting through the second type wafer, laser cutting through the first type wafer from a surface of the first type wafer on an opposite side of the first surface to reach the second surface of the second type wafer.

19. The method according to claim 18, wherein the bonding of the first type wafer and the second type wafer takes place in a vacuum or inert gas atmosphere.

20. The method according to claim 18, wherein the first type wafer comprises gallium nitride and silicon carbide layers, the second type wafer comprises diamond, the metal bump connectors comprise gold, the solder layer comprises a tin-gold alloy, the first resin material layer comprises a benzocyclobutene-based polymeric material, and the second resin material layer comprises a benzocyclobutene-based polymeric material.

* * * * *